(12) United States Patent
Huang et al.

(10) Patent No.: US 9,773,879 B2
(45) Date of Patent: Sep. 26, 2017

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Yi-Jyun Huang, Hsinchu (TW); Tung-Heng Hsieh, Hsinchu County (TW); Bao-Ru Young, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/157,283

(22) Filed: May 17, 2016

(65) Prior Publication Data

US 2017/0154967 A1 Jun. 1, 2017

Related U.S. Application Data

(60) Provisional application No. 62/261,256, filed on Nov. 30, 2015.

(51) Int. Cl.
*H01L 21/02* (2006.01)
*H01L 29/417* (2006.01)
(Continued)

(52) U.S. Cl.
CPC .... *H01L 29/41791* (2013.01); *H01L 21/0217* (2013.01); *H01L 21/02164* (2013.01);
(Continued)

(58) Field of Classification Search
CPC ......... H01L 21/823821; H01L 29/7855; H01L 2029/7858
(Continued)

(56) References Cited

U.S. PATENT DOCUMENTS 7,667,271 B2  2/2010  Yu et al.
7,910,453 B2  3/2011  Xu et al.
(Continued)

OTHER PUBLICATIONS

Office Action dated Jul. 28, 2017, issued in Taiwanese Patent Application No. 10620782200.

*Primary Examiner* — Trung Q Dang
(74) *Attorney, Agent, or Firm* — McDermott Will & Emery LLP

(57) ABSTRACT

A semiconductor device includes a fin structure, first and second gate structures, a source/drain region, a source/drain contact, a separator, a plug contacting the source/drain contact and a wiring contacting the plug. The fin structure protrudes from an isolation insulating layer and extends in a first direction. The first and second gate structures are formed over the fin structure and extend in a second direction crossing the first direction. The source/drain region is disposed between the first and second gate structures. The interlayer insulating layer is disposed over the fin structure, the first and second gate structures and the source/drain region. The first source/drain contact is disposed on the first source/drain region. The separator is disposed adjacent to the first source/drain contact layer. Ends of the first and second gate structures and an end of the source drain contact are in contact with a same face of the separator.

20 Claims, 21 Drawing Sheets

(51) Int. Cl.
*H01L 21/311* (2006.01)
*H01L 21/28* (2006.01)
*H01L 29/40* (2006.01)
*H01L 29/66* (2006.01)

(52) U.S. Cl.
CPC .. *H01L 21/28247* (2013.01); *H01L 21/31105* (2013.01); *H01L 29/401* (2013.01); *H01L 29/41783* (2013.01); *H01L 29/66795* (2013.01)

(58) Field of Classification Search
USPC ........................................................ 257/283
See application file for complete search history.

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2014/0001574 A1 | 1/2014 | Chen et al. |
| 2014/0110755 A1 | 4/2014 | Colinge |
| 2014/0151812 A1 | 6/2014 | Liaw |
| 2015/0279972 A1* | 10/2015 | Xie .................. H01L 29/66795 438/283 |
| 2015/0364378 A1* | 12/2015 | Xie ................ H01L 21/823437 257/368 |

\* cited by examiner

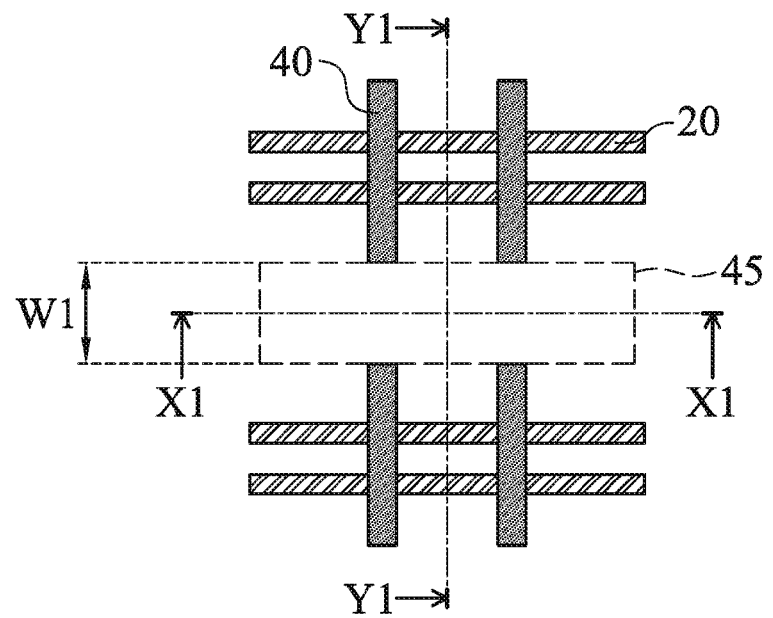
FIG. 2A
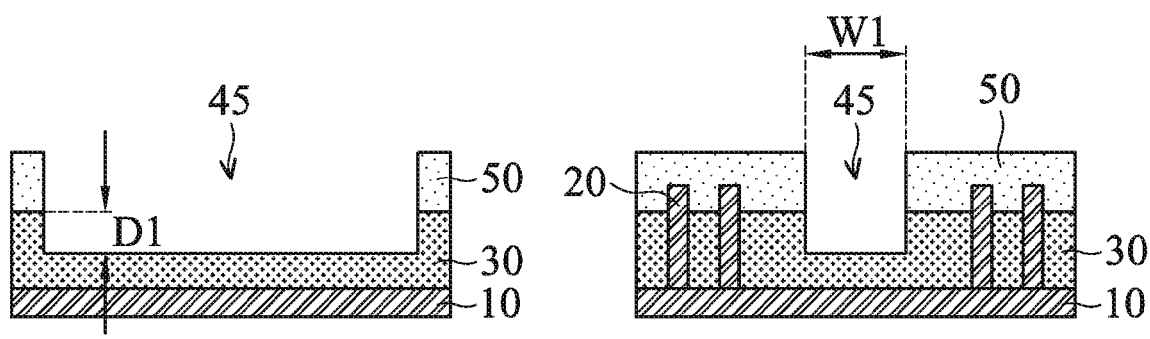
FIG. 2B
FIG. 2C

SEMICONDUCTOR DEVICE AND A METHOD FOR FABRICATING THE SAME

RELATED APPLICATIONS

This application claims a priority of U.S. Provisional Application No. 62/261,256 filed on Nov. 30, 2015, the entire contents of which are incorporated herein by reference.

TECHNICAL FIELD

The disclosure relates to methods for manufacturing semiconductor devices and the semiconductor devices, and more particularly to structures and manufacturing methods for self-align contact structures over source/drain regions.

BACKGROUND

With a decrease of dimensions of semiconductor devices, a self-aligned contact (SAC) has been widely utilized for fabricating, e.g., source/drain (S/D) contacts arranged closer to gate structures in a field effect transistor (FET). Typically, a SAC is fabricated by patterning an interlayer dielectric (ILD) layer, under which a contact etch-stop layer (CESL) is formed over the gate structure having sidewall spacers. The initial etching of the ILD layer stops at the CESL, and then the CESL is etched to form the SAC. As the device density increases (i.e., the dimensions of semiconductor device decreases), the thickness of the sidewall spacer becomes thinner, which may cause a short circuit between the S/D contact and the gate electrodes. Further, a separation between two adjacent source/drain contacts has become tight. Accordingly, it has been needed to provide SAC structures and manufacturing process with improved electrical isolation between the S/D contacts.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A-8D show various stages of an exemplary sequential fabrication process of a semiconductor device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIG. 1A-8D show various stages of an exemplary sequential fabrication process of a semiconductor device according to one embodiment of the present disclosure. It is understood that additional operations can be provided before, during, and after processes shown by FIGS. 1A-8D, and some of the operations described below can be replaced or eliminated, for additional embodiments of the method. The order of the operations/processes may be interchangeable.

Figure 1A:
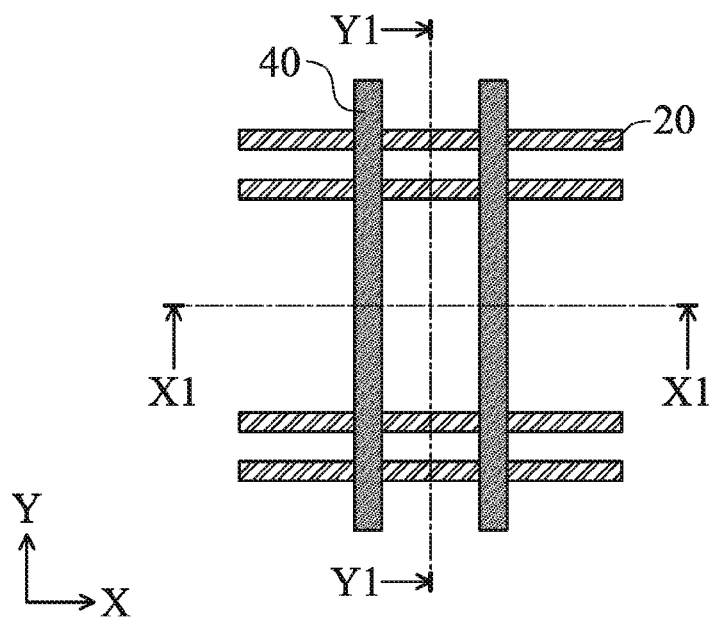
Figure 1B:
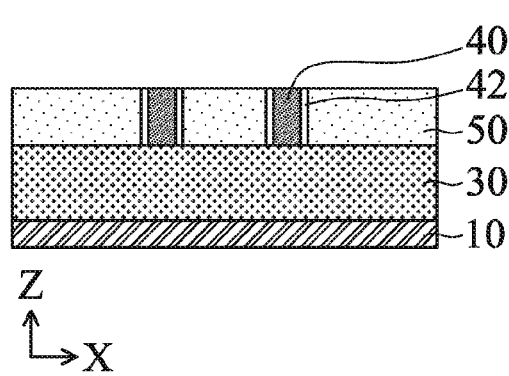
Figure 1C:
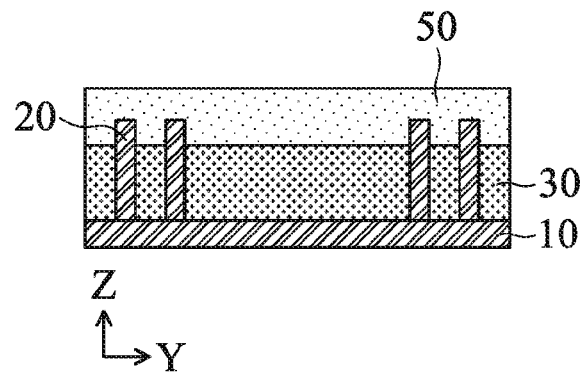

FIGS. 1A-1C show one stage of a sequential fabrication process of a semiconductor device according to one embodiment of the present disclosure. FIG. 1A shows a plan (top) view, FIG. 1B shows a cross sectional view along line X1-X1 of FIG. 1A, and FIG. 1C shows a cross sectional view along line Y1-Y1 of FIG. 1A.

Figure 1D:
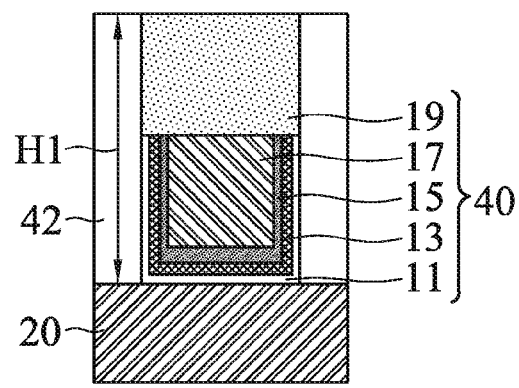

FIGS. 1A-1C show a structure of a semiconductor device after gate structures are formed. In FIGS. 1A-1C, a gate structure 40 is formed over a channel layer, for example, a part of a fin structure 20, which is formed over a substrate 10. The gate structure 40 is disposed over the fin structure 20 in the Z direction. Plural gate structures 40 extend in the Y direction and are arranged in parallel with each other. The plurality of gate structures 40 are spaced from each other in the X direction. The plural fin structures 20 extend in the X direction and are arranged in parallel with each other. The plurality of fin structures 20 are spaced from each other in the Y direction, as shown in FIG. 1A. The thickness (height H1) of the gate structures 40 is in a range from about 15 nm to about 50 nm in some embodiments. In one embodiment of the present disclose, the gate structure 40 is a metal including a gate dielectric layer (see, FIG. 1D) formed by one or more layers of dielectric materials and a metal gate electrode (see, FIG. 1D) formed by one or more layers of conductive materials. The metal gate structure 40 further includes a cap insulating layer disposed over the metal gate electrode in some embodiments. The gate structure 40 (as shown in FIG. 1D) is manufactured by a gate replacement technology, in accordance with some embodiments. In certain embodiments, the gate structure 40 includes a gate dielectric layer and a polysilicon gate electrode. The width of the gate structure 40 is in a range from about 5 nm to about 15 nm in some embodiments.

As shown in FIG. 1B, sidewall spacers 42 (omitted in FIG. 1A) are formed on both sidewalls of the gate structure 40. The film thickness of the sidewall spacers 42 at the bottom of the sidewall spacers is in a range from about 1 nm to about 10 nm in some embodiments, and is in a range from about 2 nm to about 8 nm in other embodiments.

As shown in FIG. 1B and 1C, an isolation insulating layer 30 is formed over the substrate 10. A bottom portion of the fin structure 20 is embedded in the isolation insulating layer 30 and an upper portion (channel layer) of the fin structure 20 protrudes from the isolation insulating layer 30. The gate structure 40 is also formed over the isolation insulating layer 30.

In FIGS. 1A-1C, two gate structures 40 and four fin structures 20 are illustrated. However, the number of the gate structures 40 and the fin structures 20 is not limited to two and four, respectively.

FIG. 1D shows an exemplary structure of the metal gate structure 40. The metal gate structure 40 includes a gate dielectric layer 13 and a metal gate electrode 17. The metal gate electrode 17 includes one or more layers of metal material, such as Al, Cu, W, Ti, Ta, TiN, TiAl, TiAlC, TiAlN, TAN, NiSi, CoSi, other conductive materials. The gate dielectric layer 13 is disposed between the channel layer of the fin structure 20 and the metal gate electrode 17 and includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interface dielectric layer 11 made of, for example silicon dioxide, is formed between the channel layer and the gate dielectric layer.

In some embodiments, one or more work function adjustment layers 15 are interposed between the gate dielectric layer 13 and the metal gate electrode 17. The work function adjustment layers are made of a conductive material such as a single layer of TiN, TAN, TaAlC, TiC, TaC, Co, Al, TiAl, HfTi, TiSi, TaSi or TiAlC, or a multilayer of two or more of these materials. For the n-channel FET, one or more of TAN, TaAlC, TiN, TiC, Co, TiAl, HfTi, TiSi and TaSi is used as the work function adjustment layer, and for the p-channel FET, one or more of TiAlC, Al, TiAl, TAN, TaAlC, TiN, TiC and Co is used as the work function adjustment layer.

The cap insulating layer 19 disposed over the metal gate electrode 17 includes one or more layers of insulating material such as silicon nitride based material including SiN, SiCN and SiOCN.

The material of the sidewall spacer 42 includes one or more of $SiO_2$, SiN, SiOC or SiOCN. Further, as shown in FIGS. 1B and 1C, a first interlayer dielectric layer (ILD) 50 is formed over the isolation insulating layer 30 and the gate structures 40 are embedded in the ILD 50. In FIG. 1A, the substrate 10, the isolation insulating layer 30 and first ILD 50 are omitted.

The structure including a gate structure 40 of FIGS. 1A-1C may be fabricated by the following operations. In this embodiment, fin field effect transistors (Fin FETs) fabricated by a gate-replacement process are employed.

First, a fin structure is fabricated over a substrate. The fin structure 20 includes a bottom region and an upper region as a channel region. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure, an isolation insulating layer 30 is formed over the fin structure. This isolation insulating layer is also called STI (shallow trench isolation). The isolation insulating layer includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer over the fin structure, a planarization operation is performed so as to remove part of the isolation insulating layer. The planarization operation may include a chemical mechanical polishing (CMP) and/or an etch-back process. Then, the isolation insulating layer is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers including one or more layers of insulating materials are also formed on sidewalls of the dummy gate electrode layer. After the dummy gate structure is formed, the fin structure not covered by the dummy gate structure is recessed below the upper surface of the isolation insulating layer. Then, a source/drain region is formed over the recessed fin structure by using an epitaxial growth method. The source/drain region may include a strain material to apply stress to the channel region.

Then, an interlayer dielectric layer (ILD) 50 is formed over the dummy gate structure and the source/drain region. After a planarization operation, the dummy gate structure is removed so as to make a gate space. Then, in the gate space, a metal gate structure including a metal gate electrode and a gate dielectric layer, such as a high-k dielectric layer, is formed.

FIGS. 2A-2C show one stage of a sequential fabrication process of a semiconductor device according to one embodiment of the present disclosure. FIG. 2A shows a plan (top) view, FIG. 2B shows a cross sectional view along line X1-X1 of FIG. 2A, and FIG. 2C shows a cross sectional view along line Y1-Y1 of FIG. 2A. In FIG. 2A, the substrate 10, the isolation insulating layer 30 and first ILD 50 are omitted.

After the gate structures 40 are formed over the fin structures 20 and the isolation insulating layer 30, by the operation shown in FIGS. 2A-2C, the gate structures 40 are cut into plural pieces of gate structures 40 for respective transistors. A mask layer having an opening extending in the X direction, for example, a photo resist layer or a hard mask layer, is formed over the structure shown in FIGS. 1A-1C, and then patterning operations, such as dry etching and/or wet etching, are performed so as to cut the gate patterns. Further, the first ILD 50 and the isolation insulating layer 30 are also etched, so that an opening 45 is formed. The isolation insulating layer 30 is etched (recessed) to a depth D1, which is less than about 80 nm and in a range from about 30 nm to about 60 nm in some embodiments. The width W1 of the opening 45 is in a range from about 20 nm to about 80 nm in some embodiments. In some embodiments, the isolation insulating layer 30 is not etched (i.e., D1=0).

Figure 3A:
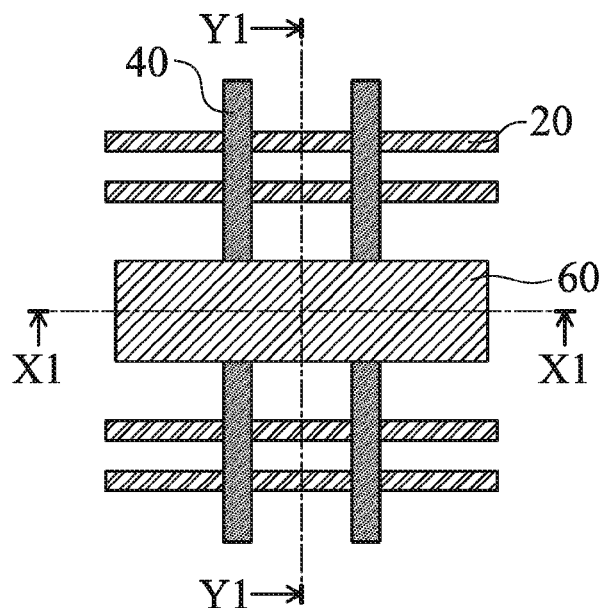
Figures 3B, 3C:
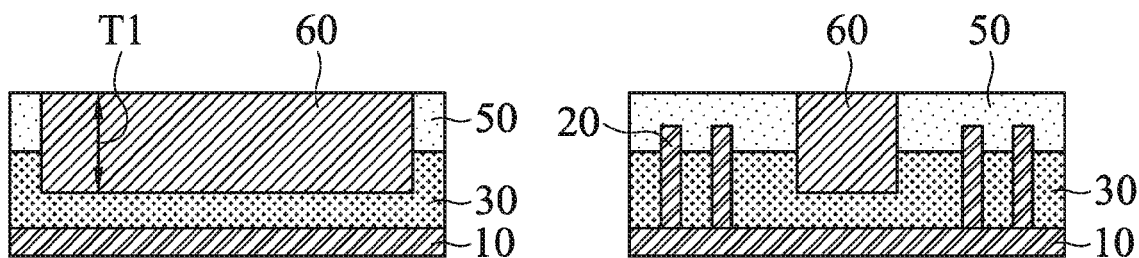

FIGS. 3A-3C show one stage of a sequential fabrication process of a semiconductor device according to one embodiment of the present disclosure. FIG. 3A shows a plan (top) view, FIG. 3B shows a cross sectional view along line X1-X1 of FIG. 3A, and FIG. 3C shows a cross sectional view along line Y1-Y1 of FIG. 3A. In FIG. 3A, the substrate 10, the isolation insulating layer 30 and first ILD 50 are omitted.

After the gate structures 40 are cut into plural pieces of gate structures, the opening 45 is filled with an insulating material, as shown in FIGS. 3A-3C to form a separator 60. The insulating material for the separator 60 includes one or more layers of insulating material having a higher etching selectivity against the materials of the isolation insulating layer 30 and the first ILD 50. Such materials include silicon nitride based materials, such as SiN, SiON or SiOCN, or aluminum based materials, such as aluminum oxide (which may be collectively referred to as AlO), aluminum oxynitride (which may be collectively referred to as AlON) or aluminum nitride (which may be collectively referred to as AlN). In one embodiment, SiN is used for the separator 60.

To form the separator 60, a blanket layer of an insulating material, for example, SiN, is formed over the structure of FIGS. 2A-2C, and then a planarization operation, such as an etch-back process and/or a chemical mechanical polishing (CMP) process, is performed. The thickness T1 of the separator 60 is in a range from about 30 nm to about 60 nm in some embodiments.

Figure 4A:
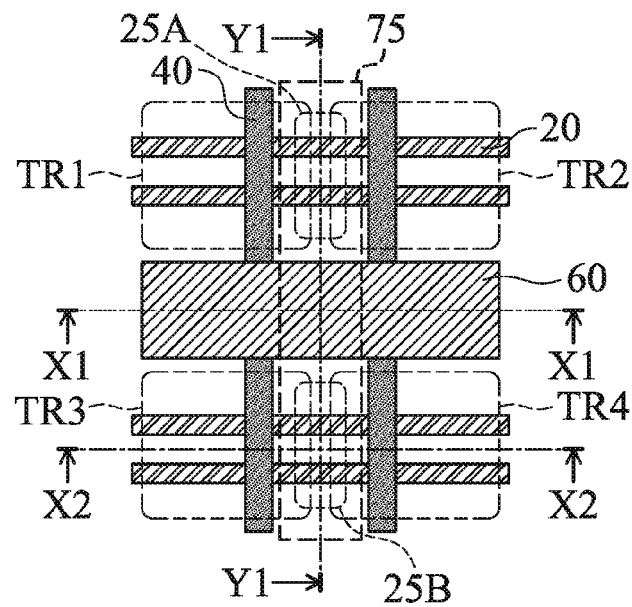
Figure 4B:
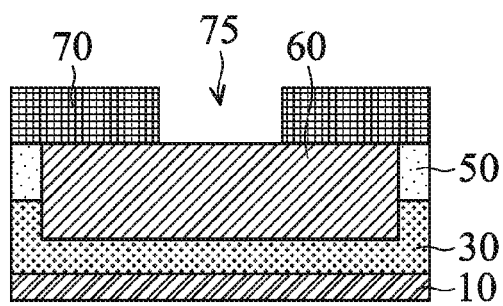
Figure 4C:
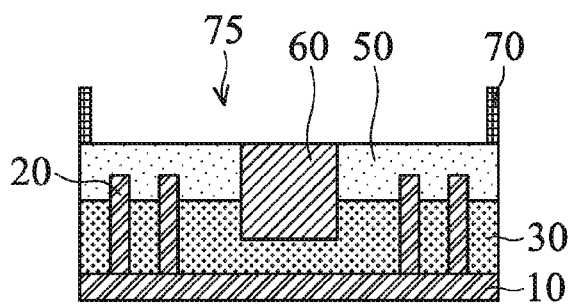
Figure 4D:
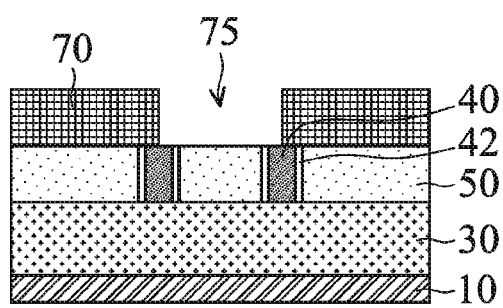

FIGS. 4A-4D show one stage of a sequential fabrication process of a semiconductor device according to one embodiment of the present disclosure. FIG. 4A shows a plan (top) view, FIG. 4B shows a cross sectional view along line X1-X1 of FIG. 4A, FIG. 4C shows a cross sectional view along line Y1-Y1 of FIG. 4A, and FIG. 4D shows a cross sectional view along line X2-X2 of FIG. 4A. In FIG. 4A, the substrate 10, the isolation insulating layer 30, first ILD 50 and the mask layer 70 are omitted.

After the separator 60 is formed, a mask layer 70 having an opening 75 extending in the Y direction, for example, a photo resist layer or a hard mask layer, is formed over the structure shown in FIGS. 3A-3C. The opening 75 corresponds to sources/drains of respective transistors. The edges of the opening 75 along the Y direction may or may not overlap with the gate structures 40.

In the present embodiment, a first transistor TR1, a second transistor TR2, a third transistor TR3, and a fourth transistor TR4 are formed, as shown in FIG. 4A (shown by broken lines). The first transistor TR1 and the second transistor TR2 share the same source/drain region 25A and the third transistor TR3 and the fourth transistor TR4 share the same source/drain region 25B. In the present embodiment, the source/drain regions 25A and 25B are formed over two fin structures, respectively. It is noted that in this disclosure, a source and a drain are used to merely distinguish one from another, and are interchangeably used. A source/drain refers to one of a source or a drain.

Figure 5A:
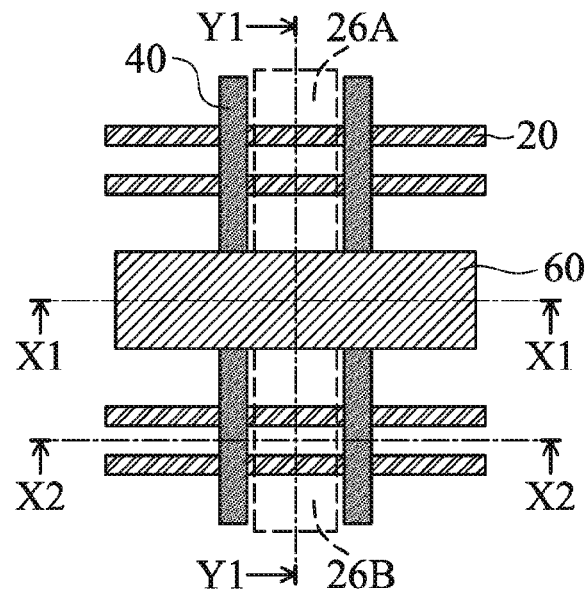
Figure 5B:
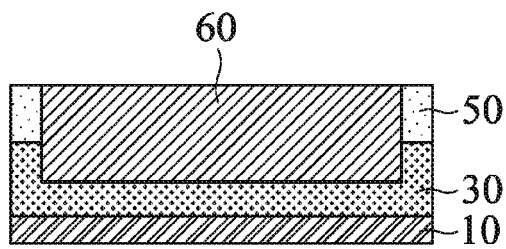
Figure 5C:
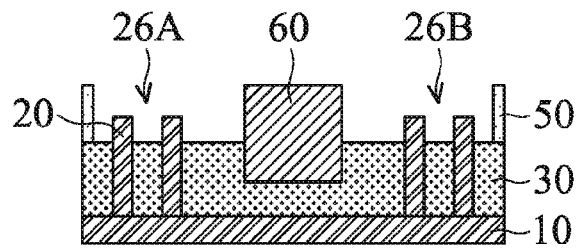
Figure 5D:
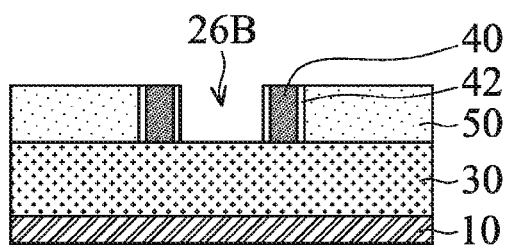

FIGS. 5A-5D show one stage of a sequential fabrication process of a semiconductor device according to one embodiment of the present disclosure. FIG. 5A shows a plan (top) view, FIG. 5B shows a cross sectional view along line X1-X1 of FIG. 5A, FIG. 5C shows a cross sectional view along line Y1-Y1 of FIG. 5A, and FIG. 5D shows a cross sectional view along line X2-X2 of FIG. 5A. In FIG. 5A, the substrate 10, the isolation insulating layer 30 and first ILD 50 are omitted.

Subsequent to FIGS. 4A-4D, by using the mask layer 70 as an etching mask, the first ILD 50 is partially etched to expose the source/drain regions 25A, 25B, as shown in FIGS. 5A and 5C. Since the separator 60 is made of a silicon nitride based material (e.g., SiN) and the first ILD 50 is made of silicon oxide based material (e.g., $SiO_2$), the openings 26A, 26B over the source/drain regions 25A, 25B can be formed into separated patterns in a self-aligned manner in the Y direction. Further, when the sidewall spacers 40 and the cap insulating layer 19 of the gate structure 40 are made of a silicon nitride based material (e.g., SiN), the openings 26A, 26B over the source/drain regions 25A, 25B can also be formed in a self-aligned manner in the X direction.

Figure 6A:
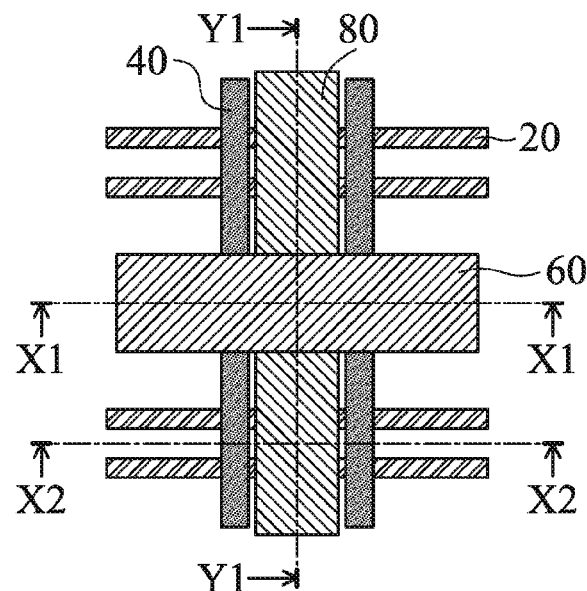
Figure 6B:
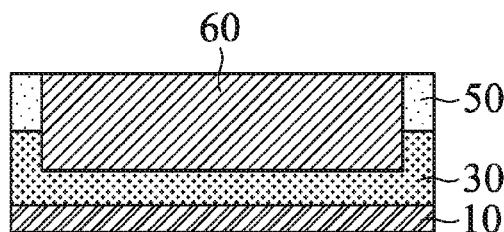
Figure 6C:
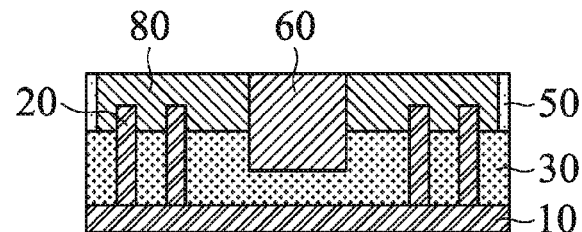
Figure 6D:
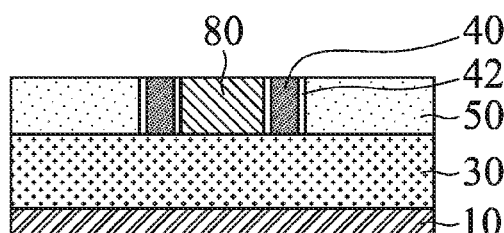

FIGS. 6A-6D show one stage of a sequential fabrication process of a semiconductor device according to one embodiment of the present disclosure. FIG. 6A shows a plan (top) view, FIG. 6B shows a cross sectional view along line X1-X1 of FIG. 6A, FIG. 6C shows a cross sectional view along line Y1-Y1 of FIG. 6A, and FIG. 6D shows a cross sectional view along line X2-X2 of FIG. 6A. In FIG. 6A, the substrate 10, the isolation insulating layer 30 and first ILD 50 are omitted.

After the source/drain openings 26A and 26B are formed, a conductive material is formed in the openings to obtain a source/drain contact layer 80. The conductive material for the source/drain contact layer 80 includes one or more layers of W, Cu, Co, Ni, or silicide thereof. To form the source/drain contact layer 80, a blanket layer of the conductive material is formed by, for example, CVD, physical vapor deposition (PVD) including sputtering, atomic layer deposition (ALD), or other suitable film forming methods. Then, a planarization operation, such as an etch-back process and/or a chemical mechanical polishing (CMP) process, is performed, thereby obtaining the structure of FIGS. 6A-6D. There may be an adhesion layer and/or a barrier layer formed before forming the conductive material.

Figure 7A:
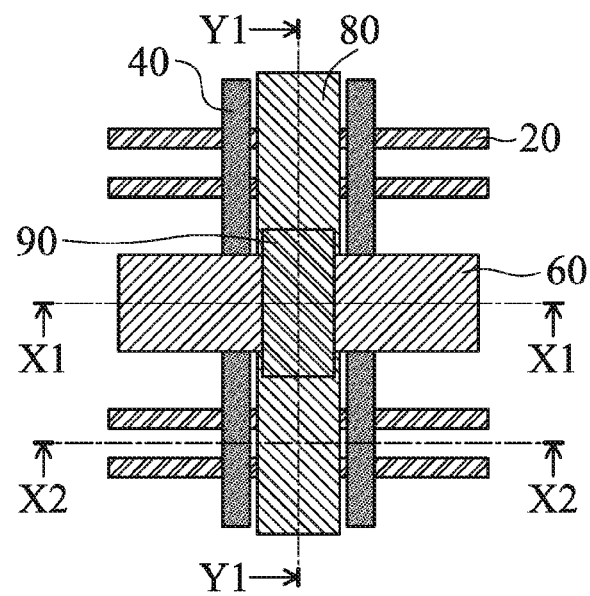
Figure 7B:
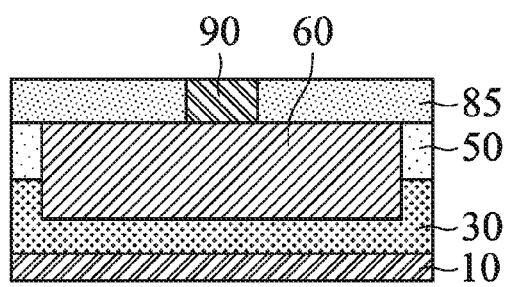
Figure 7C:
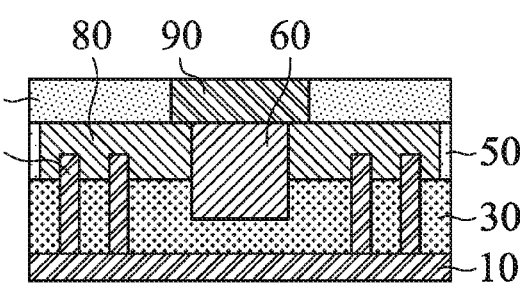
Figure 7D:
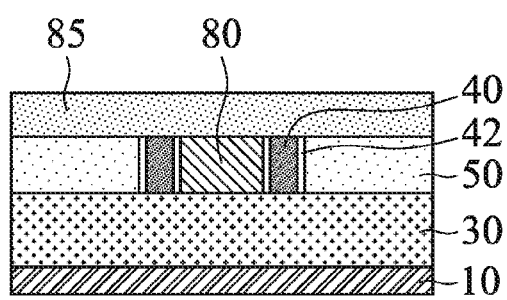

FIGS. 7A-7D show one stage of a sequential fabrication process of a semiconductor device according to one embodiment of the present disclosure. FIG. 7A shows a plan (top) view, FIG. 7B shows a cross sectional view along line X1-X1 of FIG. 7A, FIG. 7C shows a cross sectional view along line Y1-Y1 of FIG. 7A, and FIG. 7D shows a cross sectional view along line X2-X2 of FIG. 7A. In FIG. 7A, the substrate 10, the isolation insulating layer 30, first ILD 50 and the second ILD 85 are omitted.

After the source/drain contact layers 80 are formed, a second ILD 85 and a first via plug 90 are formed as shown in FIGS. 7A-7D. The second ILD 85 includes one or more layers of insulating materials, such as $SiO_2$, SiOC, SiOCN, or a low-k dielectric material (e.g., k<3). The first via plug 90 can be formed by using a damascene process. The material for the first via plug 90 includes one or more layers of W, Co, Ni, Ti, TiN, Ta, TAN or other suitable conductive materials. In this embodiment, the first via plug 90 connects two source/drain contact layers 80 for the source/drain regions 25A and 25B.

Figure 8A:
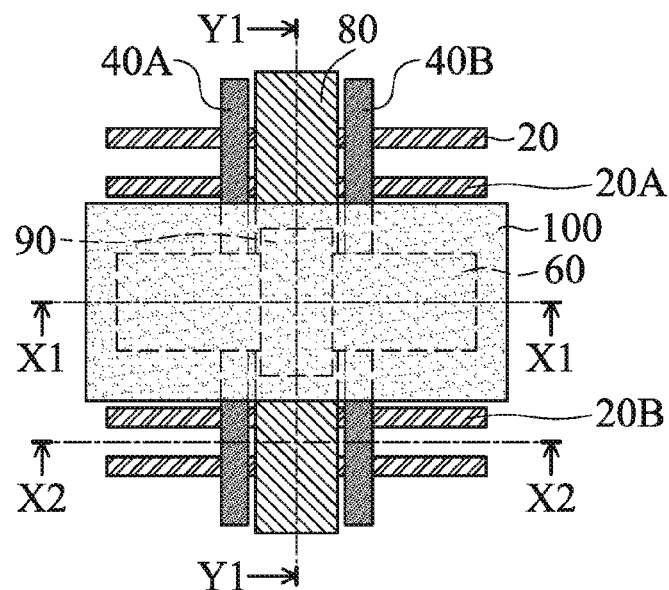
Figure 8B:
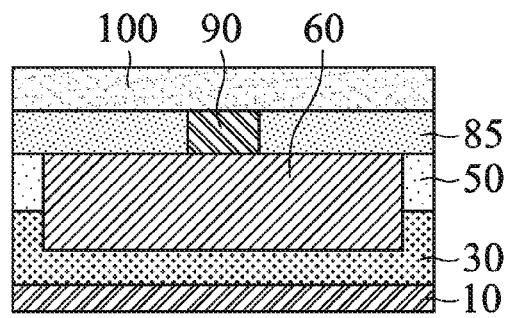
Figure 8C:
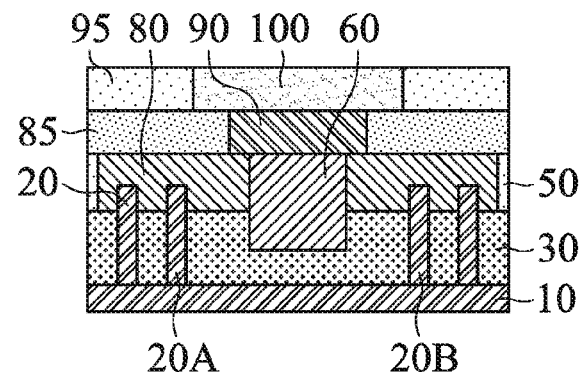
Figure 8D:
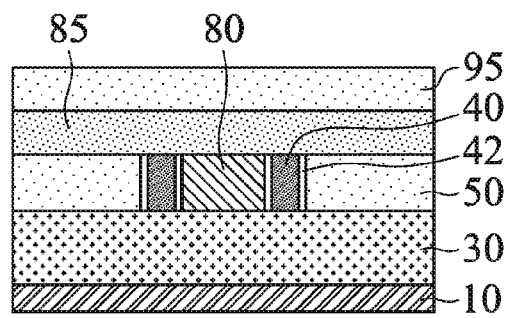

FIGS. 8A-8D show one stage of a sequential fabrication process of a semiconductor device according to one embodiment of the present disclosure. FIG. 8A shows a plan (top) view, FIG. 8B shows a cross sectional view along line X1-X1 of FIG. 8A, FIG. 8C shows a cross sectional view along line Y1-Y1 of FIG. 8A, and FIG. 8D shows a cross sectional view along line X2-X2 of FIG. 8A. In FIG. 8A, the substrate 10, the isolation insulating layer 30, first ILD 50, the second ILD 85 and the third ILD 95 are omitted.

A third ILD 95 and a first metal wiring 100 are subsequently formed over the structure of FIGS. 7A-7D. The third ILD 95 includes one or more layers of insulating materials, such as $SiO_2$, SiOC, SiOCN, or a low-k dielectric material (e.g., k<3). The material for the first metal wiring 100 includes one or more layers of Cu, Al, Ti, TiN, Ta, TAN or other suitable conductive materials. The first metal wiring 100 can be formed by using a damascene process.

As shown in FIGS. 8A-8D, a first fin structure 20A and a second fin structure 20B isolated from the first fin structure 20A by an isolation insulating layer 30 are disposed over a substrate 10. A first fin field effect transistor (Fin FET) TR1 and a second Fin FET TR2 (see, FIG. 4A) are formed over the first fin structure 20A. The first Fin FET includes a first gate electrode 40A and the second Fin FET includes a second gate electrode 40B. A first source/drain region 25A (see, FIG. 4A) is shared by and disposed between the first Fin FET TR1 and the second Fin FET TR2. An interlayer insulating layer 50 is disposed over the first and second fin structures, the first and second Fin FETs and the first source/drain region. A first source/drain contact layer 80 is disposed on the first source/drain region and extends toward the second fin structure such that a part of the first source/drain contact layer 80 is located over the isolation insulating layer 30. A first via plug 90 is disposed on the part of the first source/drain contact layer 80 and is located over the isolation insulating layer 30. A first metal wiring layer 100 is disposed on the first via plug 90. An end of the first source/drain contact layer 80 is in contact with a separator 60 made of an insulating material that is different from the isolation insulating layer 30 and the first ILD 50. Further, ends of the gate structures 40A, 40B and an end of the first source drain contact layer 80 are in contact with a same face of the separator 60.

It is understood that the device shown in FIGS. 8A-8D undergoes further CMOS processes to form various features such as interconnect metal layers, dielectric layers, passivation layers, etc.

Figure 9:
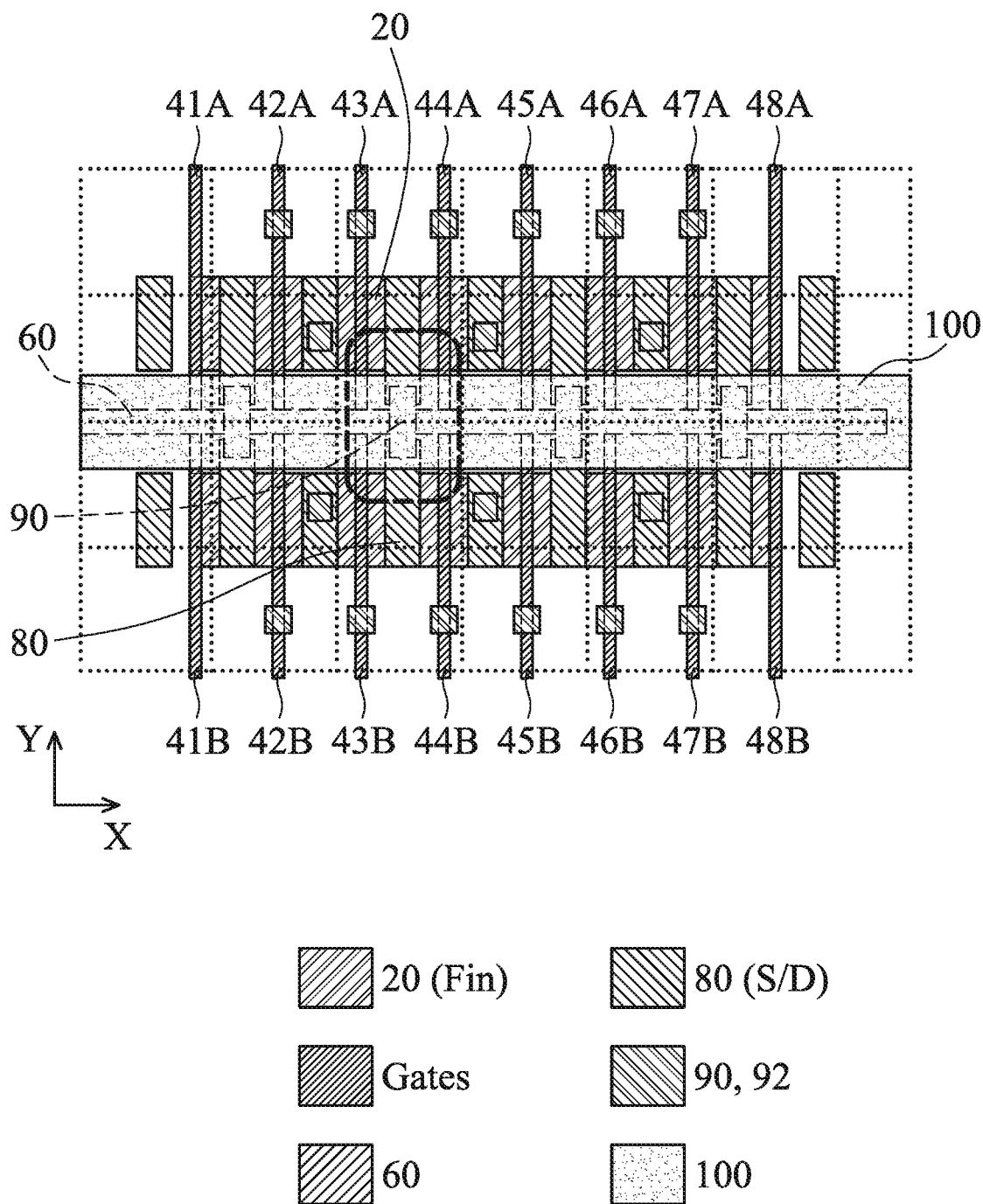
FIGS. 9 and 10 show exemplary layout structures of a semiconductor device according to one embodiment of the present disclosure.

FIG. 9 shows an exemplary layout structure of a semiconductor device according to one embodiment of the present disclosure.

In FIG. 9, a plurality of gate structures 41A-48A and 41B-48B extend in the Y direction and are arranged in the X direction. In some embodiments, the plurality of gate structures 41A-48A and 41B-48B are arranged with a constant pitch in the X direction. The separator 60 extends in the X direction and separates the gate structures 41A-48A from the gate structures 41B-48B. A source/drain region disposed between the gate structure 43A and 44A is electrically connected by the first via plug 90 to a source/drain region disposed between the gate structure 43B and 44B, and the first via plug 90 is connected to the first metal wiring 100. In FIG. 9, more than two gate structures and more than two source/drain contact layers are in contact with the same face of the separator 60.

Figure 10:
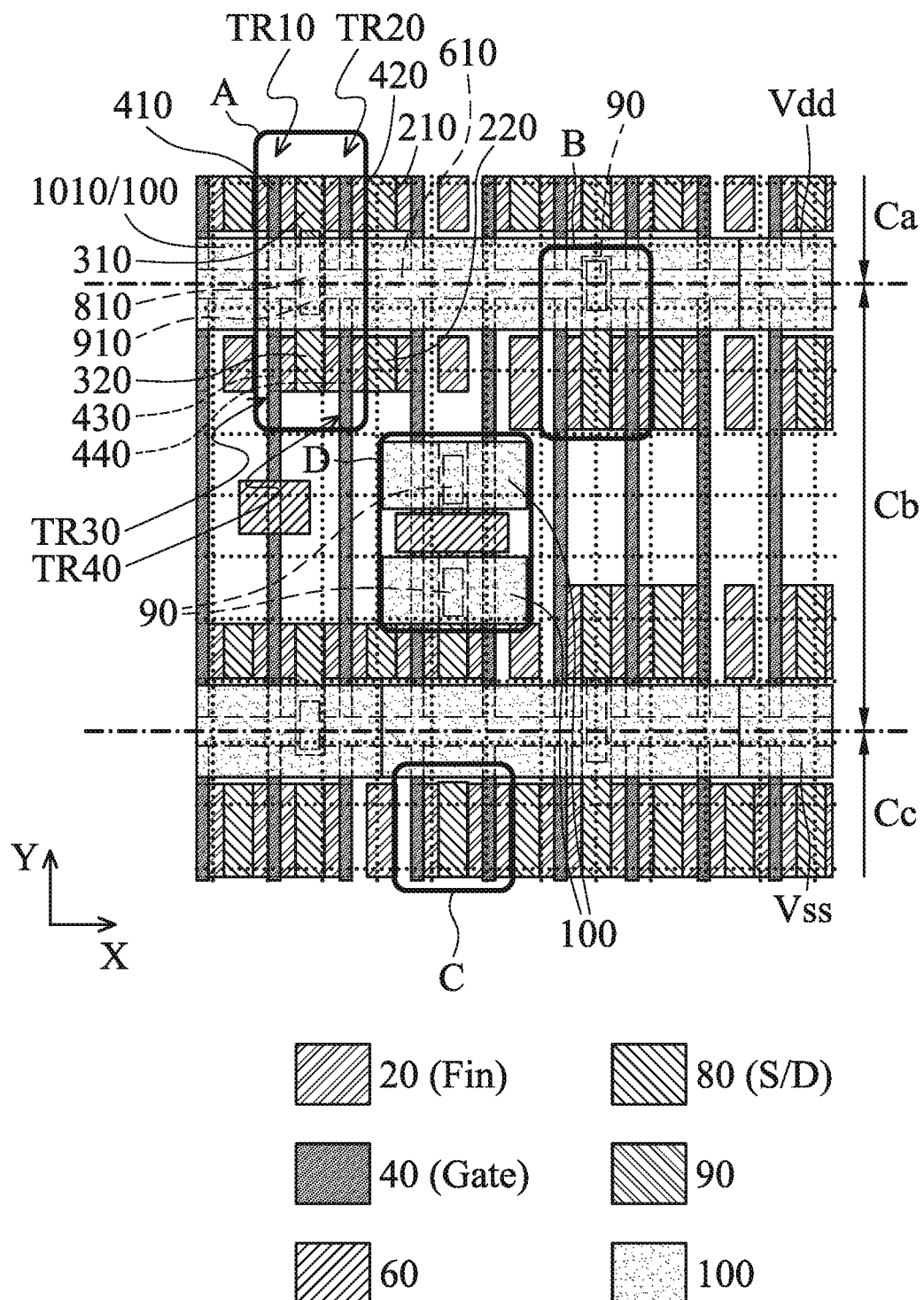

FIG. 10 shows an exemplary layout structure of standard cells for a semiconductor device according to one embodiment of the present disclosure.

In FIG. 10, a standard cell CB is disposed between standard cells Cell CA and Cell CC in the Y direction. Power supply lines Vdd and Vss extending in the X direction are disposed on the boundaries of the cells. The power supply lines Vdd and Vss are made by the first metal wirings 100.

The structure and manufacturing process explained by FIGS. 1A-8D correspond to the formation of enclosed area A in FIG. 10. The structure and manufacturing process explained infra by FIGS. 11A-15D correspond to the formation of enclosed area B in FIG. 10, the structure and manufacturing process explained infra by FIGS. 16A-20D correspond to the formation of enclosed area C in FIG. 10, and The structure and manufacturing process explained infra by FIGS. 21A-21D correspond to the formation of enclosed area D in FIG. 10.

In the area A, two source/drain contact layers adjacent to each other in the Y direction are connected to the power supply line made by a metal wiring 100 via the first via plug 90. In the area A, a first fin structure 210 and a second fin structure 220 isolated from the first fin structure by an isolation insulating layer are disposed. A first fin field effect transistor (Fin FET) TR10 and a second Fin FET TR20 are both formed over the first fin structure 210. The first Fin FET TR10 includes a first gate electrode 410 and the second Fin FET TR20 includes a second gate electrode 420. A first source/drain region 310 is shared by and disposed between the first Fin FET TR10 and the second Fin FET TR20. A first source/drain contact layer 810 is disposed on the first source/drain region 310 and extends toward the second fin structure 220 such that a part of the first source/drain contact layer 810 is located over the isolation insulating layer. A contact plug 910 is disposed on the part of the first source/drain contact layer and is located over the isolation insulating layer. A metal wiring layer 1010 (e.g., Vdd) is disposed on the contact plug 910. An end of the first source/drain contact layer 810 is in contact with a separator 610.

Further, a third Fin FET TR30 and a fourth Fin FET TR40 are formed over the second fin structure 220. The third Fin FET TR30 includes a third gate electrode 430, and the fourth Fin FET TR40 includes a fourth gate electrode 440. A second source/drain region 320 is shared by and disposed between the third Fin FET TR30 and the fourth Fin FET TR40. A second source/drain contact layer is disposed on the second source/drain region 320 such that the first source/drain region and the second source/drain region are physically separated by the separator 60 and are electrically connected by the first via plug 910.

Area B has a substantially similar structure to area A, except for the following configurations. In area B, only one of the two source/drain contact layers adjacent to each other in the Y direction is connected to the power supply line made by a metal wiring 100 via the first via plug 90.

Area C has the substantially similar structure to area A, except for the following configurations. In area C, neither of the two source/drain contact layers adjacent to each other in the Y direction is connected to the power supply line.

Area D has a substantially similar structure to area A, except for the following configuration. In area D, which is disposed within one standard cell, two source/drain contact layers adjacent to each other in the Y direction are connected to two metal wirings 100 via two first via plugs 90, respectively.

FIGS. 11A-15D show various stages of an exemplary sequential fabrication process of the structure corresponding to area B of FIG. 10 according to one embodiment of the present disclosure. The material, configuration, structure and/or processes employed in FIGS. 1A-8D may be utilized in the following embodiment and the details thereof may be omitted. The order of the operations/processes may be interchangeable.

Figure 11A:
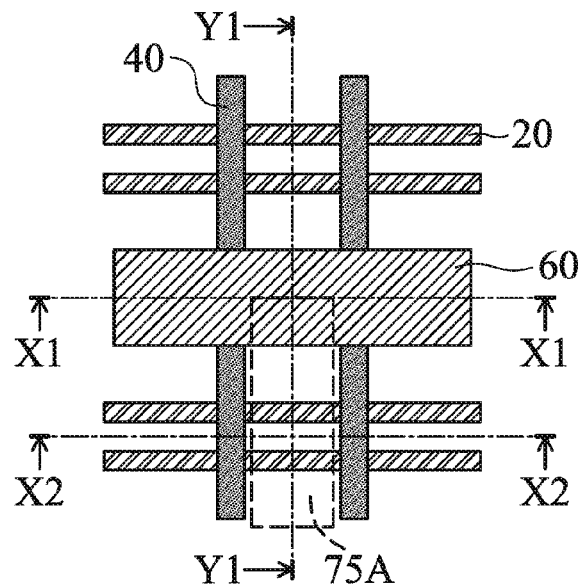
FIGS. 11A-15D show various stages of an exemplary sequential fabrication process of a semiconductor device according to one embodiment of the present disclosure.
Figure 11B:
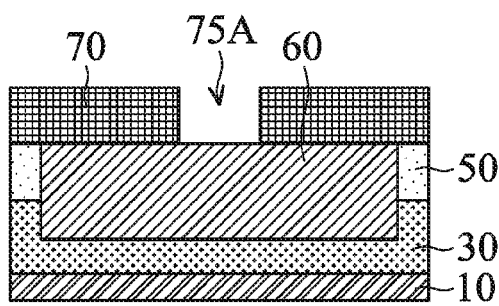
Figure 11C:
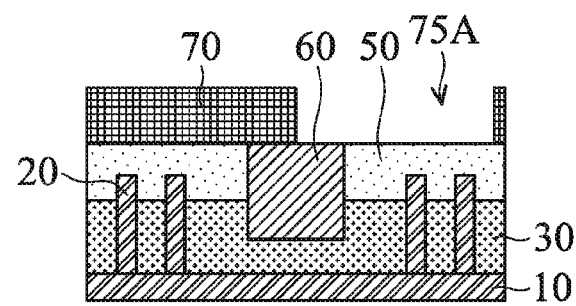
Figure 11D:
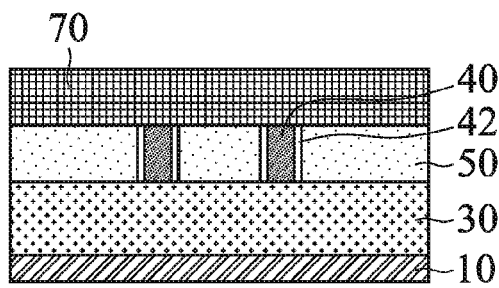

FIGS. 11A-11D show one stage of a sequential fabrication process of a semiconductor device according to one embodiment of the present disclosure. FIG. 11A shows a plan (top) view, FIG. 11B shows a cross sectional view along line X1-X1 of FIG. 11A, FIG. 11C shows a cross sectional view along line Y1-Y1 of FIG. 11A, and FIG. 11D shows a cross sectional view along line X2-X2 of FIG. 11A. In FIG. 11A, the substrate 10, the isolation insulating layer 30, and first ILD 50 are omitted.

After the structure of FIGS. 3A-3C is formed, a mask layer 70 having an opening 75A, for example, a photo resist layer or a hard mask layer, is formed over the structure shown in FIGS. 3A-3C. The opening 75A overlaps one of the source/drain regions (e.g., 25B, see, FIG. 4A) and a part of the separator 60, as shown in FIG. 11A.

Figure 12A:
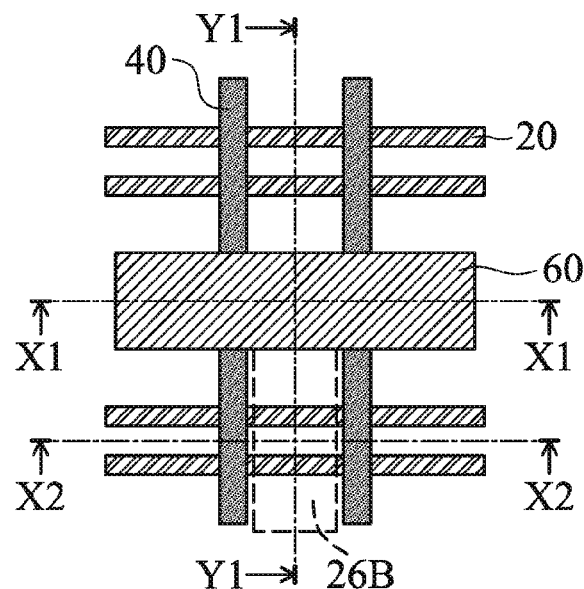
Figure 12B:
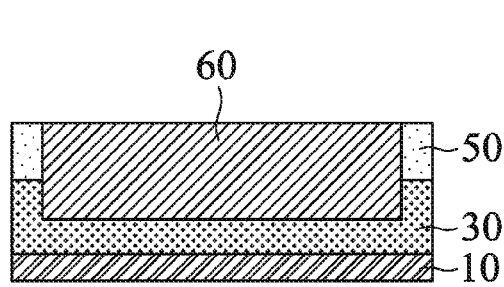
Figure 12C:
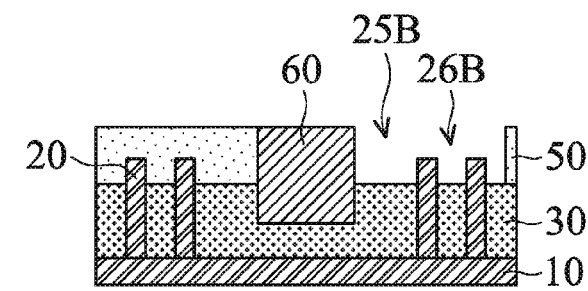
Figure 12D:
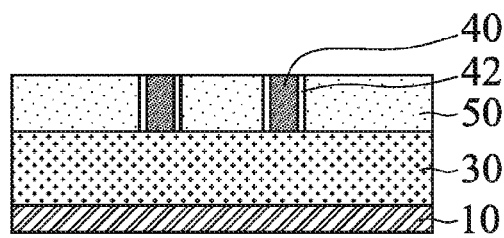

FIGS. 12A-12D show one stage of a sequential fabrication process of a semiconductor device according to one embodiment of the present disclosure. FIG. 12A shows a plan (top) view, FIG. 12B shows a cross sectional view along line X1-X1 of FIG. 12A, FIG. 12C shows a cross sectional view along line Y1-Y1 of FIG. 12A, and FIG. 12D shows a cross sectional view along line X2-X2 of FIG. 12A. In FIG. 12A, the substrate 10, the isolation insulating layer 30, and first ILD 50 are omitted.

By using the mask layer 70 as an etching mask, the first ILD 50 is partially etched to expose the source/drain region 25B, as shown in FIGS. 12A and 12C.

Figure 13A:
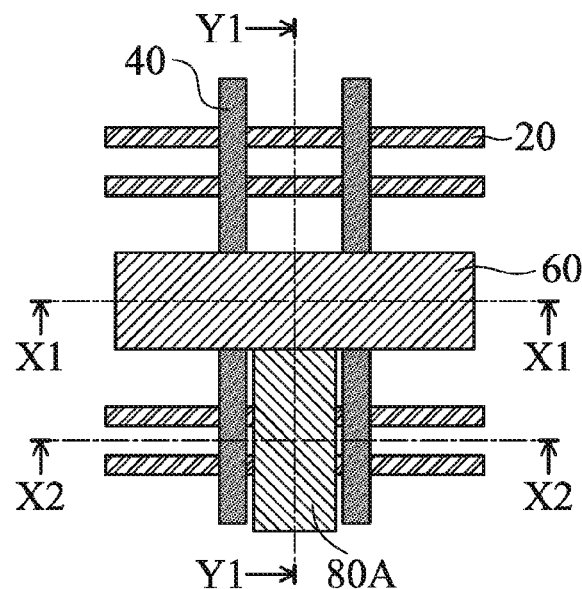
Figure 13B:
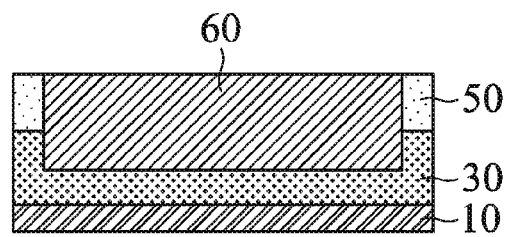
Figure 13C:
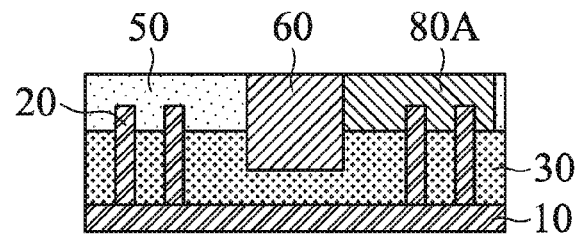
Figure 13D:
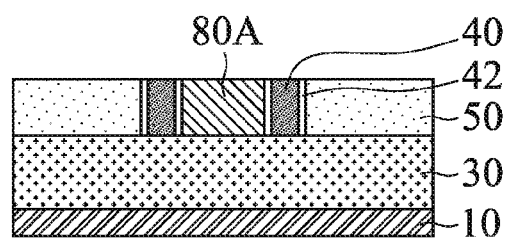

FIGS. 13A-13D show one stage of a sequential fabrication process of a semiconductor device according to one embodiment of the present disclosure. FIG. 13A shows a plan (top) view, FIG. 13B shows a cross sectional view along line X1-X1 of FIG. 13A, FIG. 13C shows a cross sectional view along line Y1-Y1 of FIG. 13A, and FIG. 13D shows a cross sectional view along line X2-X2 of FIG. 13A. In FIG. 13A, the substrate 10, the isolation insulating layer 30, and first ILD 50 are omitted.

After the source/drain opening 26B is formed, a conductive material is formed in the opening 26B to obtain a source/drain contact layer 80A.

Figure 14A:
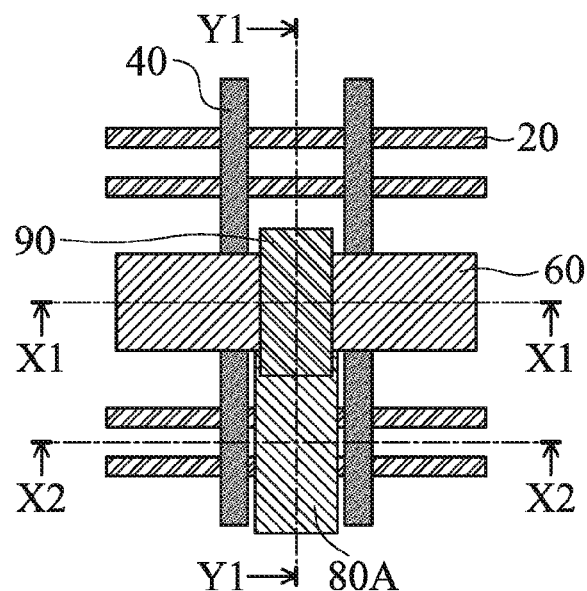
Figure 14B:
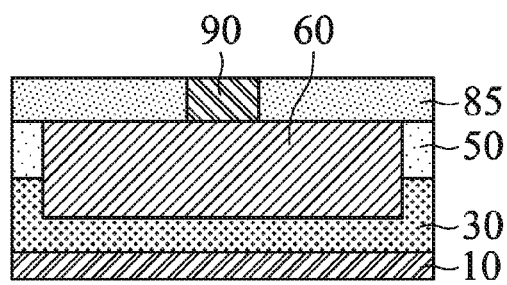
Figure 14C:
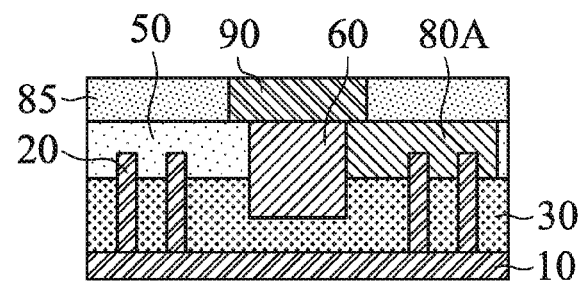
Figure 14D:
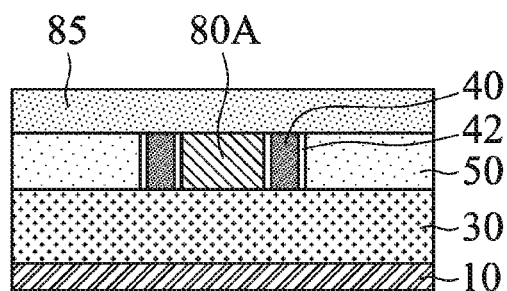

FIGS. 14A-14D show one stage of a sequential fabrication process of a semiconductor device according to one embodiment of the present disclosure. FIG. 14A shows a plan (top) view, FIG. 14B shows a cross sectional view along line X1-X1 of FIG. 14A, FIG. 14C shows a cross sectional view along line Y1-Y1 of FIG. 14A, and FIG. 14D shows a cross sectional view along line X2-X2 of FIG. 14A. In FIG. 14A, the substrate 10, the isolation insulating layer 30, first ILD 50 and the second ILD 85 are omitted.

After the source/drain contact layer 80A is formed, a second ILD 85 and a first via plug 90 are formed as shown in FIGS. 14A-14D. In this embodiment, the first via plug 90 is connected to only a single source/drain contact layer 80A, unlike the embodiment shown in FIGS. 7A and 7C, where the first via plug 90 is connected to two source/drain contact layers 80.

Figure 15A:
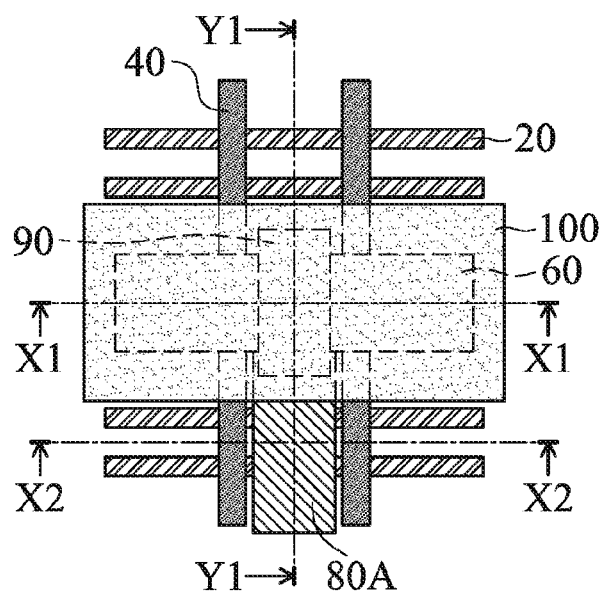
Figure 15B:
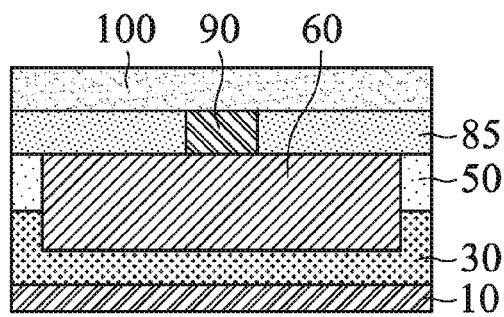
Figure 15C:
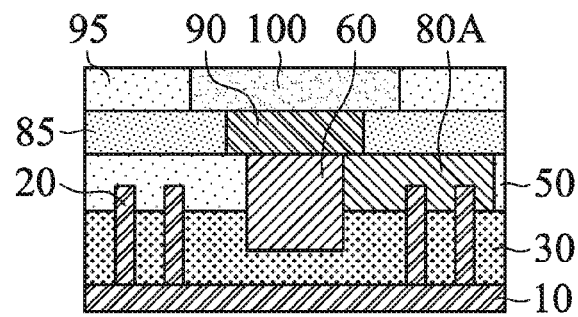
Figure 15D:
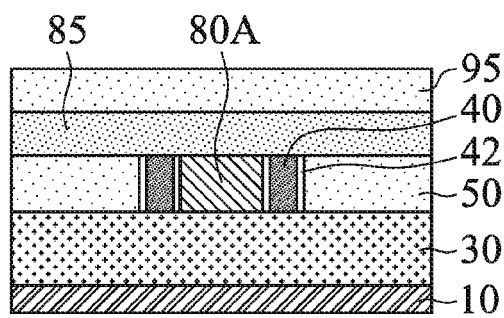

FIGS. 15A-15D show one stage of a sequential fabrication process of a semiconductor device according to one embodiment of the present disclosure. FIG. 15A shows a plan (top) view, FIG. 15B shows a cross sectional view along line X1-X1 of FIG. 15A, FIG. 15C shows a cross sectional view along line Y1-Y1 of FIG. 15A, and FIG. 15D shows a cross sectional view along line X2-X2 of FIG. 15A. In FIG. 15A, the substrate 10, the isolation insulating layer 30, first ILD 50, the second ILD 85 and the third ILD 95 are omitted.

In this embodiment, a third ILD 95 and a first metal wiring 100 are subsequently formed over the structure of FIGS. 14A-14D, as shown in FIGS. 15A-15D.

In the embodiment of FIGS. 15A-15D, unlike the structures shown in FIGS. 8A-8D, only one (e.g., 25B) of the two source/drain contact layer is connected to the metal wiring 100 via the first via plug 90.

FIGS. 16A-20D show various stages of an exemplary sequential fabrication process of the structure corresponding to area C of FIG. 10 according to one embodiment of the present disclosure. The material, configuration, structure and/or processes employed in FIGS. 1A-8D may be utilized in the following embodiment and the details thereof may be omitted. The order of the operations/processes may be interchangeable.

Figure 16A:
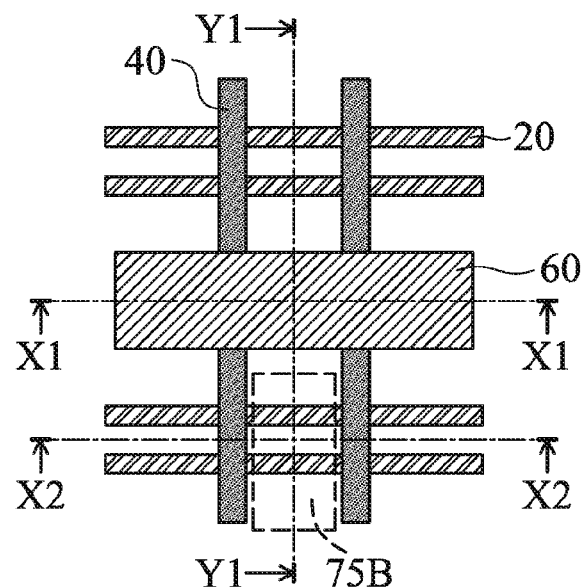
FIGS. 16A-20D show various stages of an exemplary sequential fabrication process of a semiconductor device according to one embodiment of the present disclosure.
Figure 16B:
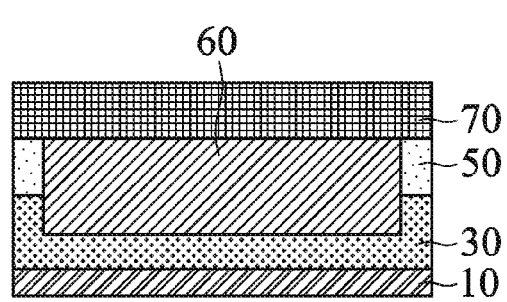
Figure 16C:
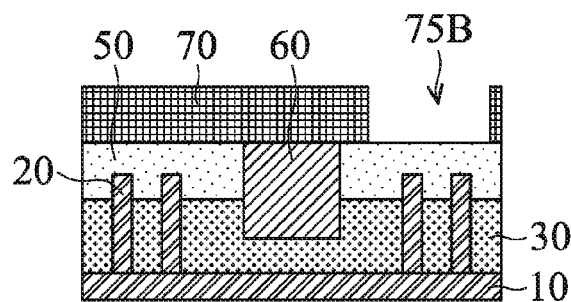
Figure 16D:
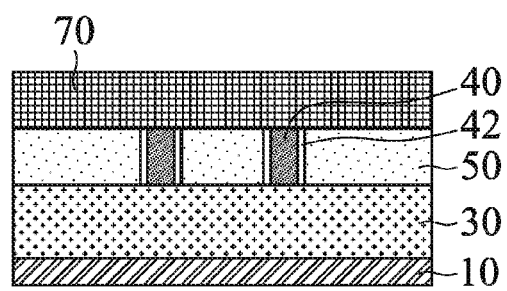

FIGS. 16A-16D show one stage of a sequential fabrication process of a semiconductor device according to one embodiment of the present disclosure. FIG. 16A shows a plan (top) view, FIG. 16B shows a cross sectional view along line X1-X1 of FIG. 16A, FIG. 16C shows a cross sectional view along line Y1-Y1 of FIG. 16A, and FIG. 16D shows a cross sectional view along line X2-X2 of FIG. 16A. In FIG. 16A, the substrate 10, the isolation insulating layer 30, and first ILD 50 are omitted.

After the structure of FIGS. 3A-3C is formed, a mask layer 70 having an opening 75B, for example, a photo resist layer or a hard mask layer, is formed over the structure shown in FIGS. 3A-3C. The opening 75B overlaps one of the source/drain regions (e.g., 25B, see, FIG. 4A) but does not overlap the separator 60, as shown in FIG. 16A.

Figure 17A:
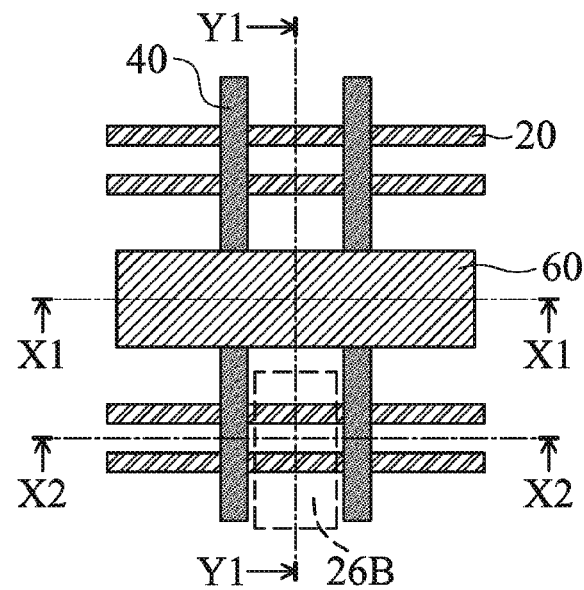
Figure 17B:
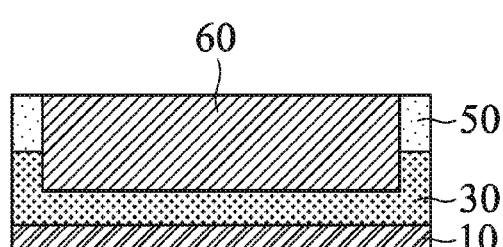
Figure 17C:
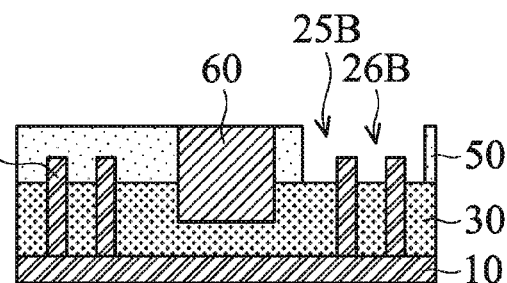
Figure 17D:
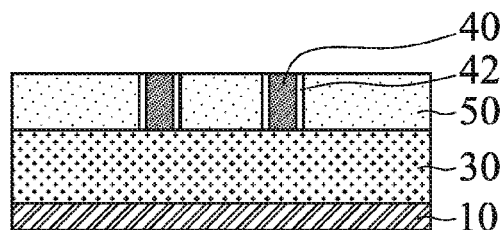

FIGS. 17A-17D show one stage of a sequential fabrication process of a semiconductor device according to one embodiment of the present disclosure. FIG. 17A shows a plan (top) view, FIG. 17B shows a cross sectional view along line X1-X1 of FIG. 17A, FIG. 17C shows a cross sectional view along line Y1-Y1 of FIG. 17A, and FIG. 17D shows a cross sectional view along line X2-X2 of FIG. 17A. In FIG. 17A, the substrate 10, the isolation insulating layer 30, and first ILD 50 are omitted.

By using the mask layer 70 as an etching mask, the first ILD 50 is partially etched to form opening 26B exposing the source/drain region 25B, as shown in FIGS. 17A and 17C.

Figure 18A:
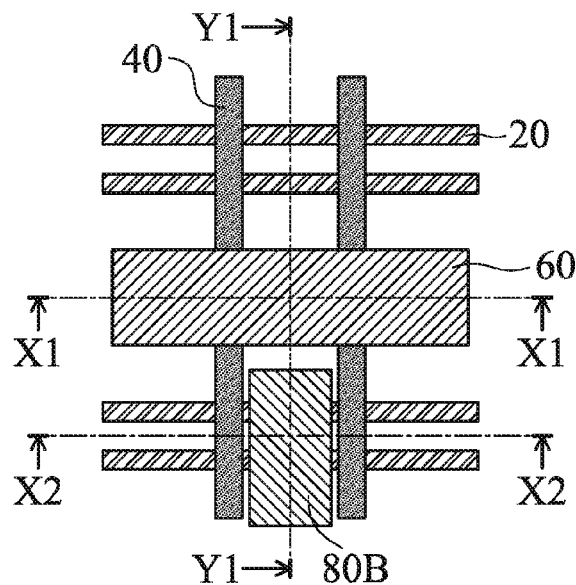
Figure 18B:
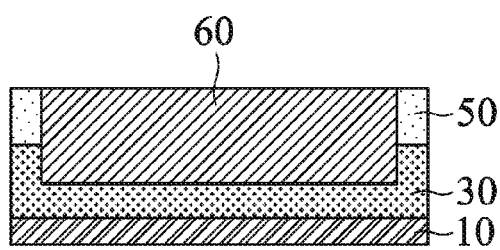
Figure 18C:
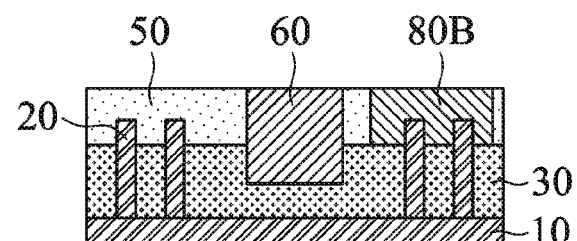
Figure 18D:
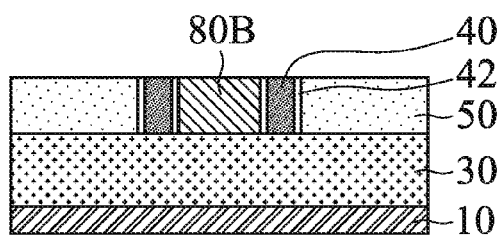

FIGS. 18A-18D show one stage of a sequential fabrication process of a semiconductor device according to one embodiment of the present disclosure. FIG. 18A shows a plan (top) view, FIG. 18B shows a cross sectional view along line X1-X1 of FIG. 18A, FIG. 18C shows a cross sectional view along line Y1-Y1 of FIG. 18A, and FIG. 18D shows a cross sectional view along line X2-X2 of FIG. 18A. In FIG. 18A, the substrate 10, the isolation insulating layer 30, and first ILD 50 are omitted.

After the source/drain opening 26B is formed, a conductive material is formed in the opening 26B to obtain a source/drain contact layer 80B.

Figure 19A:
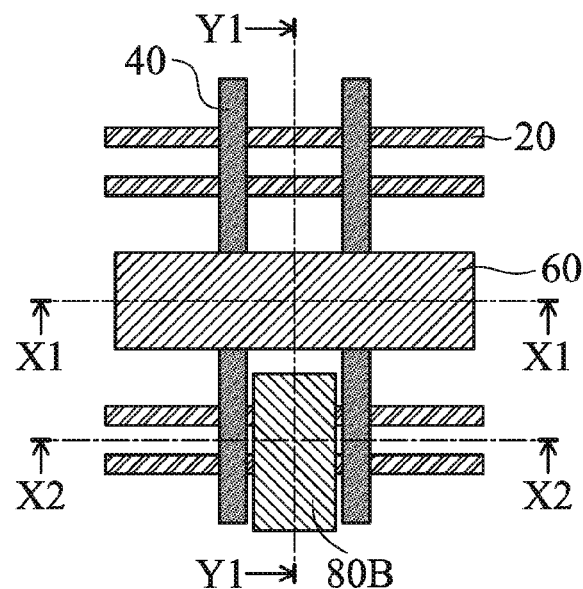
Figure 19B:
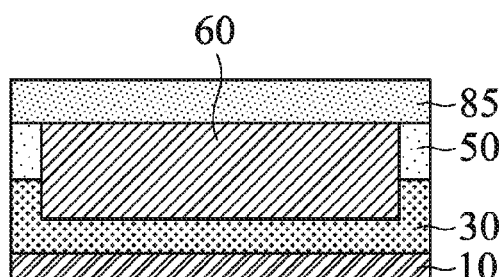
Figure 19C:
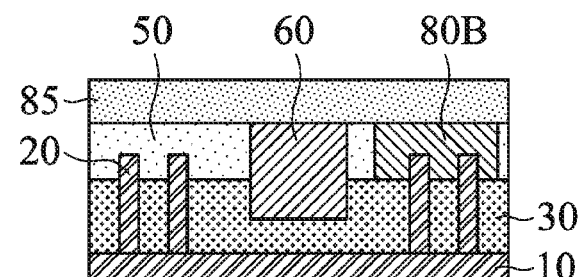
Figure 19D:
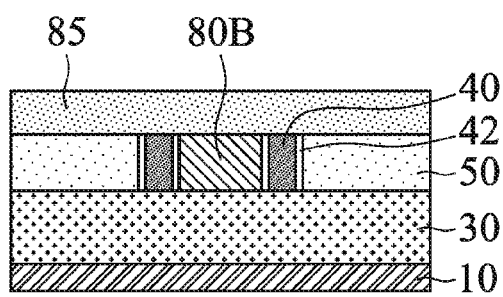

FIGS. 19A-19D show one stage of a sequential fabrication process of a semiconductor device according to one embodiment of the present disclosure. FIG. 19A shows a plan (top) view, FIG. 19B shows a cross sectional view along line X1-X1 of FIG. 19A, FIG. 19C shows a cross sectional view along line Y1-Y1 of FIG. 19A, and FIG. 19D shows a cross sectional view along line X2-X2 of FIG. 19A. In FIG. 19A, the substrate 10, the isolation insulating layer 30, first ILD 50 and the second ILD 85 are omitted.

After the source/drain contact layer 80B is formed and a second ILD 85 is formed as shown in FIGS. 19A-19D. In this embodiment, no first via plug 90 is disposed on the source/drain contact layer 80B.

Figure 20A:
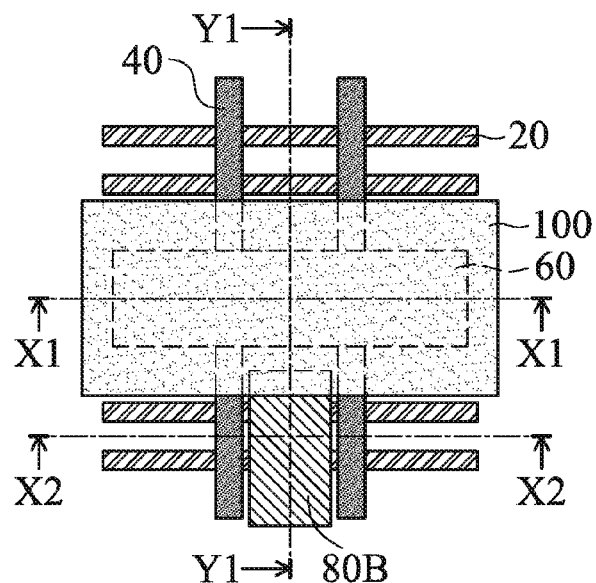
Figure 20B:
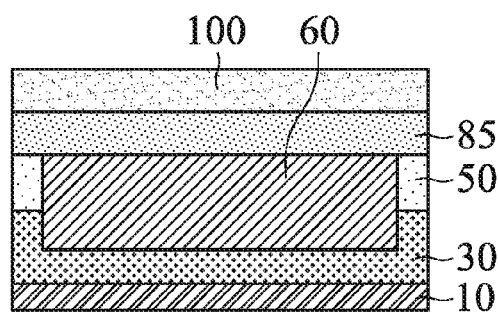
Figure 20C:
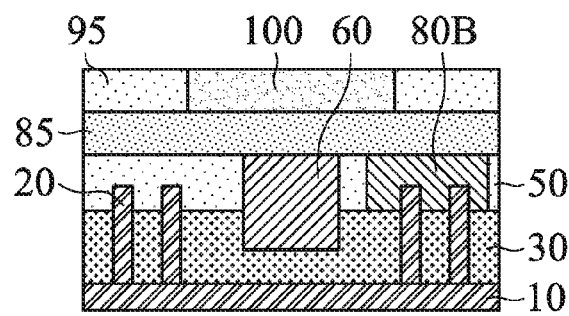
Figure 20D:
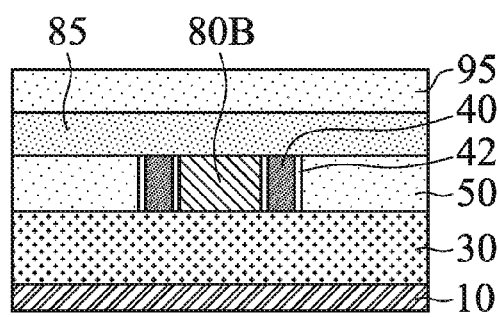
Figure 21A:
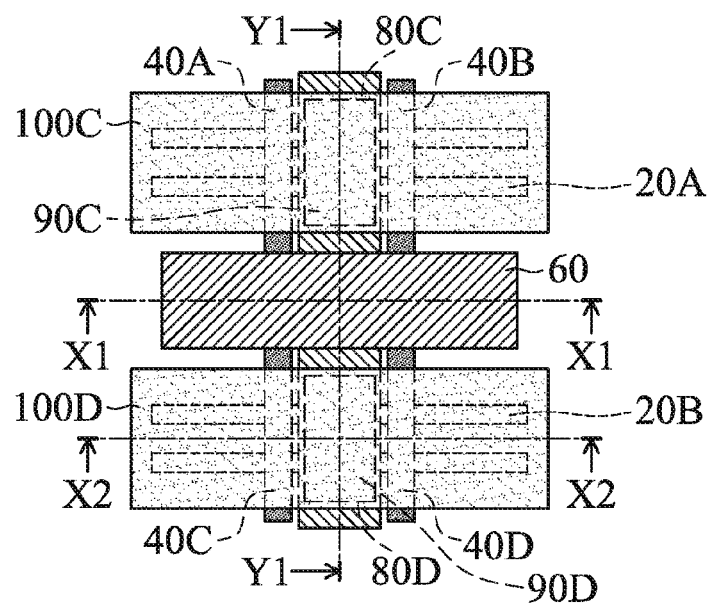
FIGS. 21A-21D show an exemplary structure of a semiconductor device according to one embodiment of the present disclosure.
Figure 21B:
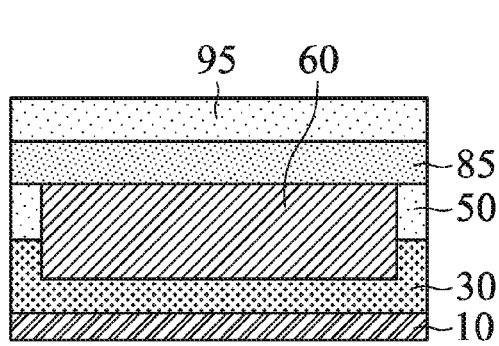
Figure 21C:
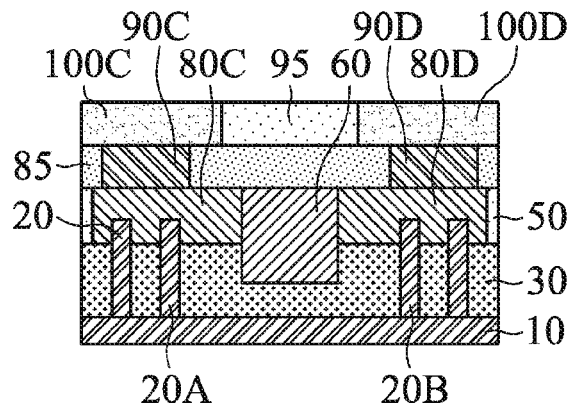
Figure 21D:
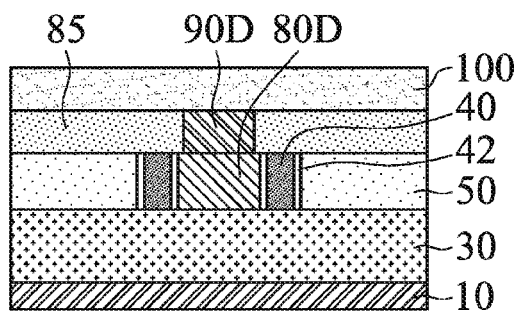

FIGS. 20A-20D show one stage of a sequential fabrication process of a semiconductor device according to one embodiment of the present disclosure. FIG. 20A shows a plan (top) view, FIG. 20B shows a cross sectional view along line X1-X1 of FIG. 20A, FIG. 20C shows a cross sectional view along line Y1-Y1 of FIG. 20A, and FIG. 20D shows a cross sectional view along line X2-X2 of FIG. 20A. In FIG. 20A, the substrate 10, the isolation insulating layer 30, first ILD 50, the second ILD 85 and the third ILD 95 are omitted.

A third ILD 95 and a first metal wiring 100 are subsequently formed over the structure of FIGS. 19A-19D, as shown in FIGS. 20A-20D.

FIGS. 21A-21D show an exemplary structure of a semiconductor device according to one embodiment of the present disclosure. The structure and manufacturing process explained below with FIGS. 21A-21D correspond to enclosed area D in FIG. 10.

As shown in FIGS. 21A-21D, a first fin structure 20A and a second fin structure 20B isolated from the first fin structure 20A by an isolation insulating layer 30 are disposed over a substrate 10. A first fin field effect transistor (Fin FET) TR1 and a second Fin FET TR2 (see, FIG. 4A) are formed over the first fin structure 20A, and a third Fin FET TR3 and a fourth Fin FET TR4 (see, FIG. 4A) are formed over the second fin structure 20B. The first Fin FET TR1 includes a first gate electrode 40A, the second Fin FET TR2 includes a second gate electrode 40B, the third Fin FET TR3 includes a third gate electrode 40C and the fourth Fin FET TR4 includes a fourth gate electrode 40D. A first source/drain region 25A (see, FIG. 4A) is shared by and disposed between the first Fin FET TR1 and the second Fin FET TR2, and a second source/drain region 25B (see, FIG. 4A) is shared by and disposed between the third Fin FET TR3 and the fourth Fin FET TR4. An interlayer insulating layer 50 is disposed over the first to fourth fin structures, the first to fourth Fin FETs and the first and second source/drain regions. A first source/drain contact layer 80C is disposed on the first source/drain region 25A and extends toward the second fin structure such that a part of the first source/drain contact layer 80C is located over the isolation insulating layer 30. A second source/drain contact layer 80D is disposed on the second source/drain region 25B and extends toward the first fin structure such that a part of the second source/drain contact layer 80C is located over the isolation insulating layer 30. A first via plug 90C is disposed on the first source/drain contact layer 80C and a second via plug 90D is disposed on the second source/drain contact layer 80D. A first metal wiring layer 100C is disposed on the first via plug 90C and a second metal wiring layer 100D is disposed on the second via plug 90D. One end of the first source/drain contact layer 80C is in contact with a separator 60 and one end of the second source/drain contact layer 80D is in contact with the separator 60.

The various embodiments or examples described herein offer several advantages over the existing art. For example, in the present disclosure, since a source/drain contact layer 80 can be formed in a self-aligned manner by using the gate cutting process and the separator 60, it is possible to reduce the circuit size, particularly, the size of standard cells. Further, it is possible to suppress the formation of rounded shapes of the ends of the source/drain contact layers, thereby suppressing a short circuit between the source/drain contact layer and a gate electrode.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, A first gate structure and a second gate structure are formed over a part of a first fin structure and a part of a second fin structure, which are disposed over a substrate, extend in a first direction, are arranged in a second direction crossing the first direction in parallel with each other and protrude from an isolation insulating layer. The first and second gate structures extend in the second direction and are arranged in the first direction in parallel with each other. An interlayer insulating layer is formed over the first and second gate structures and the first and second fin structures. A first mask layer having a first opening is formed over the interlayer insulating layer. The first opening is located above the first and second gate structures. The first and second gate structures are cut through the first opening and the isolation insulating layer and the interlayer dielectric layer disposed between the first gate structure and the second gate structure are etched through the first opening, so as to form a first recess. An insulating layer is formed in the first recess. A second mask layer having a second opening is formed so as to expose a part of the insulating layer in the first recess and a part of the interlayer dielectric layer. The second opening is located above the first fin structure. The exposed part of the interlayer dielectric layer is etched through the second opening so as to form at least one second recess over the first fin structure. A conductive material is formed in the one second recess so as to form a first source/drain contact layer.

According to another aspect of the present disclosure, a semiconductor device includes a first fin structure and a second fin structure, a first fin field effect transistor (Fin FET) and a second Fin FET, a first source/drain region, an interlayer insulating layer, a first source/drain contact layer, and a separation insulating layer. The second fin structure is isolated from the first fin structure by an isolation insulating layer. The first and second fin structures extend in a first direction. The first Fin FET and the second Fin FET are formed over the first fin structure. The first Fin FET includes a first gate electrode, and the second Fin FET includes a second gate electrode. The first and second gate electrodes extend in a second direction crossing the first direction. The first source/drain region is shared by and disposed between the first Fin FET and the second Fin FET. The interlayer insulating layer is disposed over the first and second fin structures, the first and second Fin FETs and the first source/drain region. The first source/drain contact layer is disposed on the first source/drain region and extends toward the second fin structure such that a part of the first source/drain contact layer is located over the isolation insulating layer. The separation insulating layer is disposed adjacent to the first source/drain contact layer. An end of the first source/drain contact layer is in contact with the separation insulating layer. The separation insulating layer is made of an insulating material different from the isolation insulating layer and the interlayer insulating layer.

In accordance with yet another aspect of the present disclosure, a semiconductor device includes a first fin structure, a first gate structure and a second gate structure, a first source/drain region, an interlayer insulating layer, a first source/drain contact layer, a separation insulating layer, and a first contact plug in contact with the first source/drain contact layer. The first fin structure protrudes from an isolation insulating layer disposed over a substrate and extends in a first direction. The first gate structure and the second gate structure are both formed over the first fin structure. The first and second gate structures extend in a second direction crossing the first direction. The first source/drain region is disposed between the first gate structure and the second gate structure. The interlayer insulating layer is disposed over the first fin structure, the first and second gate structures and the first source/drain region. The first source/drain contact layer is disposed on the first source/drain region. The separation insulating layer is disposed adjacent to the first source/drain contact layer. An end of the first gate structure, an end of the second gate structure and an end of the first source drain contact layer are in contact with a same face of the separation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first gate structure and a second gate structure over a part of a first fin structure and a part of a second fin structure, which are disposed over a substrate, extend in a first direction in plan view, are arranged in a second direction crossing the first direction in parallel with each other in plan view and protrude from an isolation insulating layer, the first and second gate structures extending in the second direction and being arranged in the first direction in parallel with each other in plan view;
    forming an interlayer insulating layer over the first and second gate structures and the first and second fin structures;
    forming a first mask layer having a first opening over the interlayer insulating layer, the first opening being located above the first and second gate structures;
    cutting the first and second gate structures through the first opening and etching the isolation insulating layer and the interlayer dielectric layer disposed between the first gate structure and the second gate structure through the first opening, so as to form a first recess;
    forming an insulating layer in the first recess;
    forming a second mask layer having a second opening so as to expose a part of the insulating layer in the first recess and a part of the interlayer dielectric layer, the second opening being located above the first fin structure;
    etching the exposed part of the interlayer dielectric layer through the second opening so as to form at least one second recess over the first fin structure; and
    forming a conductive material in the one second recess so as to form a first source/drain contact layer.

2. The method of claim 1, wherein the insulating layer includes SiN.

3. The method of claim 1, wherein the conductive material includes at least one of W, Co, Ni, Ti, and Ta, a silicide thereof and a nitride thereof.

4. The method of claim 1, further comprising forming a first contact plug in contact with the first source/drain contact layer,
    wherein the first contact plug includes at least one of W, Cu, Co, or Ni, and silicide thereof.

5. The method of claim 4, further comprising forming a first wiring pattern in contact with the first contact plug,
    wherein the first wiring pattern is a power supply wiring.

6. The method of claim 1, wherein:
    the second opening is also located above the second fin structure,
    in the etching the exposed part of the interlayer dielectric layer through the second opening, another second recess is formed over the second fin structure, and
    the conductive material is formed in the another second recess so as to obtain a second source/drain contact layer.

7. The method of claim 6, further comprising forming a first contact plug in contact with the first source/drain contact layer,
    wherein the first contact plug is in contact with the second source/drain contact layer.

8. The method of claim 6, further comprising:
    forming a first contact plug in contact with the first source/drain contact layer; and
    forming a second contact plug in contact with the second source/drain contact layer,
    wherein the first contact plug and the second contact plug are physically separated by an insulating material.

9. The method of claim 6, wherein:
    the second mask layer has a third opening so as to expose a part of the insulating layer outside the first recess and the one second recess and the another second recess,
    in the etching the exposed part of the interlayer dielectric layer through the second opening, the part of the insulating layer is etched through the third opening so as to form a third recess, and
    in the forming the conductive material in the one second recess and in the another second recess, the conductive material is also formed in the third recess.

10. A semiconductor device, comprising:
    a first fin structure and a second fin structure isolated from the first fin structure by an isolation insulating layer, the first and second fin structures extending in a first direction and arranged in parallel with each other in a second direction crossing the first direction a plan view;
    a first fin field effect transistor (Fin FET) and a second Fin FET, both formed over the first fin structure, the first Fin FET including a first gate electrode, the second Fin FET including a second gate electrode, the first and second gate electrodes extending in the second direction in plan view;
    a first source/drain region shared by and disposed between the first Fin FET and the second Fin FET;
    an interlayer insulating layer disposed over the first and second fin structures, the first and second Fin FETs and the first source/drain region;
    a first source/drain contact layer disposed on the first source/drain region and extending toward the second fin structure such that a part of the first source/drain contact layer is located over the isolation insulating layer; and
    a separation insulating layer disposed adjacent to the first source/drain contact layer, wherein:
    the first source/drain contact layer has a first end and a second along the second direction, in plan view,
    the first end of the first source/drain contact layer is in contact with a side face of the separation insulating layer,
    a top face of the separation insulating layer is in contact with the interlayer insulating layer, and the separation insulating layer is made of an insulating material different from the isolation insulating layer and the interlayer insulating layer.

11. The semiconductor device of claim 10, wherein the first source/drain contact layer includes at least one of W, Co, Ni, Ti, and Ta, a silicide thereof and a nitride thereof.

12. The semiconductor device of claim 10, wherein the insulating material of the separation insulating layer is SiN.

13. The semiconductor device of claim 10, further comprising:
  a third Fin FET and a fourth Fin FET, both formed over the second fin structure, the third Fin FET including a third gate electrode, the fourth Fin FET including a fourth gate electrode;
  a second source/drain region shared by and disposed between the third Fin FET and the fourth Fin FET; and
  a second source/drain contact layer disposed on the second source/drain region and extending toward the first fin structure such that a part of the second source/drain contact layer is located over the isolation insulating layer, wherein:
  the second source/drain contact layer has a first end and a second along the second direction, in plan view,
  the first end of the second source/drain contact layer is in contact with the separation insulating layer, and
  the second source/drain contact layer is physically separated from the first source/drain contact layer by the separation insulating layer.

14. The semiconductor device of claim 13, further comprising a first contact plug in contact with the first source/drain contact layer,
  wherein the first contact plug is in contact with the second source/drain contact layer and the separation insulating layer.

15. The semiconductor device of claim 13, further comprising:
  a first contact plug in contact with the first source/drain contact layer; and
  a second contact plug in contact with the second source/drain contact layer.

16. The semiconductor device of claim 10, further comprising:
  a third fin structure;
  a fifth Fin FET and a sixth Fin FET, both formed over the third fin structure, the fifth Fin FET including a fifth gate electrode, the sixth Fin FET including a sixth gate electrode;
  a third source/drain region shared by and disposed between the fifth Fin FET and the sixth Fin FET; and
  a third source/drain contact layer disposed on the third source/drain region,
  wherein the third source/drain contact layer is not electrically connected to an adjacent source/drain region in the second direction.

17. A semiconductor device, comprising:
  a first fin structure protruding from an isolation insulating layer disposed over a substrate and extending in a first direction in plan view;
  a first gate structure and a second gate structure, both formed over the first fin structure, the first and second gate structures extending in a second direction crossing the first direction in plan view;
  a first source/drain region disposed between the first gate structure and the second gate structure;
  an interlayer insulating layer disposed over the first fin structure, the first and second gate structures and the first source/drain region;
  a first source/drain contact layer disposed on the first source/drain region;
  a separation insulating layer disposed adjacent to the first source/drain contact layer; and
  a first contact plug in contact with the first source/drain contact layer and the interlayer insulating layer, wherein:
  the first gate structure has a first end and a second end along the second direction, the second gate structure has a first end and a second end along the second direction and the first source drain contact layer has a first end and a second end along the second direction, in plan view, and
  the first end of the first gate structure, the first end of the second gate structure and the first end of the first source drain contact layer are in contact with a first side face of the separation insulating layer.

18. The semiconductor device of claim 17, further comprising:
  a second fin structure protruding from the isolation insulating layer and extending in the first direction, and arranged in parallel with the first fin structure so that the separation insulating layer is disposed between the first fin structure and the second fin structure, in plan view;
  a third gate structure and a fourth gate structure, both formed over the second fin structure, the third and fourth gate structures extending in the second direction;
  a second source/drain region disposed between the third gate structure and the fourth gate structure; and
  a second source/drain contact layer disposed on the second source/drain region,
  wherein an end of the third gate structure, an end of the fourth gate structure and an end of the second source drain contact layer are in contact with a second side face of the separation insulating layer that is an opposite side face to the first side face of the separation insulating layer.

19. The semiconductor device of claim 18; wherein the first contact plug is in contact with the second source/drain contact layer.

20. The semiconductor device of claim 18, further comprising:
  a first wiring pattern in contact with the first contact plug;
  a second contact plug in contact with the second source/drain contact layer; and
  a second wiring pattern in contact with the second contact plug.

* * * * *